(12) United States Patent
Shih et al.

(10) Patent No.: US 10,741,511 B2
(45) Date of Patent: Aug. 11, 2020

(54) FAN-OUT PACKAGE AND METHODS OF FORMING THEREOF

(71) Applicant: Taiwan Semiconductor Manufacturing Company, Ltd., Hsinchu (TW)

(72) Inventors: Wan-Ting Shih, Hsinchu (TW); Nai-Wei Liu, Fengshan (TW); Jing-Cheng Lin, Hsinchu (TW); Cheng-Lin Huang, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 16/525,083

(22) Filed: Jul. 29, 2019

(65) Prior Publication Data
US 2019/0355684 A1 Nov. 21, 2019

Related U.S. Application Data

(63) Continuation of application No. 15/727,070, filed on Oct. 6, 2017, now Pat. No. 10,366,960, which is a
(Continued)

(51) Int. Cl.
*H01L 23/00* (2006.01)
*H01L 23/498* (2006.01)
(Continued)

(52) U.S. Cl.
CPC .......... *H01L 24/04* (2013.01); *H01L 23/3114* (2013.01); *H01L 23/3128* (2013.01);
(Continued)

(58) Field of Classification Search
CPC ............... H01L 21/568; H01L 23/3114; H01L 23/3128; H01L 23/49822; H01L 23/5389;
(Continued)

(56) References Cited

U.S. PATENT DOCUMENTS 6,902,950 B2  6/2005  Ma et al.
7,863,096 B2  1/2011  England
(Continued)

FOREIGN PATENT DOCUMENTS

CN  101252125 A  8/2008
CN  102169879 A  8/2011
(Continued)

*Primary Examiner* — Long K Tran
(74) *Attorney, Agent, or Firm* — Slater Matsil, LLP (57) ABSTRACT

An embodiment is a method including depositing a first dielectric layer over a molding compound and a chip and patterning a first opening in the first dielectric layer to expose a contact of the chip. A first metallization layer is deposited over the first dielectric layer and in the first opening, where a portion of the first metallization layer in the first opening has a flat top. A second dielectric layer is deposited over the first metallization layer and the first dielectric layer. A second metallization layer is deposited in a second opening in the second dielectric layer, where the second metallization layer does not have a flat top within the second opening.

20 Claims, 4 Drawing Sheets

Related U.S. Application Data continuation of application No. 14/322,842, filed on Jul. 2, 2014, now Pat. No. 9,824,989.

(60) Provisional application No. 61/928,836, filed on Jan. 17, 2014.

(51) Int. Cl.
*H01L 23/538* (2006.01)
*H01L 23/31* (2006.01)
*H01L 21/56* (2006.01)

(52) U.S. Cl.
CPC .... *H01L 23/49822* (2013.01); *H01L 23/5389* (2013.01); *H01L 24/03* (2013.01); *H01L 24/14* (2013.01); *H01L 24/19* (2013.01); *H01L 24/82* (2013.01); *H01L 24/97* (2013.01); *H01L 21/568* (2013.01); *H01L 23/49816* (2013.01); *H01L 24/13* (2013.01); *H01L 24/32* (2013.01); *H01L 24/73* (2013.01); *H01L 2224/0239* (2013.01); *H01L 2224/02317* (2013.01); *H01L 2224/02379* (2013.01); *H01L 2224/04105* (2013.01); *H01L 2224/12105* (2013.01); *H01L 2224/131* (2013.01); *H01L 2224/13022* (2013.01); *H01L 2224/13144* (2013.01); *H01L 2224/13147* (2013.01); *H01L 2224/13155* (2013.01); *H01L 2224/24137* (2013.01); *H01L 2224/32245* (2013.01); *H01L 2224/73267* (2013.01); *H01L 2224/97* (2013.01); *H01L 2924/01022* (2013.01); *H01L 2924/01029* (2013.01); *H01L 2924/181* (2013.01)

(58) Field of Classification Search
CPC ......... H01L 24/04; H01L 24/14; H01L 24/19; H01L 24/82; H01L 24/97
USPC ........................................................ 257/737
See application file for complete search history.

(56) References Cited

U.S. PATENT DOCUMENTS

| | | | |
|---|---|---|---|
| 8,343,809 | B2 | 1/2013 | Lin et al. |
| 8,759,209 | B2 | 6/2014 | Lin et al. |
| 8,829,676 | B2 | 9/2014 | Yu et al. |
| 2004/0155352 | A1 | 8/2004 | Ma |
| 2005/0205978 | A1 | 9/2005 | Pu et al. |
| 2008/0054460 | A1 | 3/2008 | Hung |
| 2008/0122078 | A1 | 5/2008 | He et al. |
| 2008/0136009 | A1 | 6/2008 | Theuss |
| 2008/0197469 | A1 | 8/2008 | Yang et al. |
| 2012/0001328 | A1 | 1/2012 | Chang et al. |
| 2012/0313243 | A1 | 12/2012 | Chang et al. |
| 2013/0001776 | A1 | 1/2013 | Yu et al. |
| 2015/0050781 | A1 | 2/2015 | Guzek et al. |
| 2015/0115464 | A1* | 4/2015 | Yu ................. H01L 21/6836 257/774 |
| 2018/0033747 | A1 | 2/2018 | Shih et al. |

FOREIGN PATENT DOCUMENTS

| | | |
|---|---|---|
| CN | 102487049 A | 6/2012 |
| CN | 102856279 A | 1/2013 |
| KR | 20110017011 A | 2/2011 |
| KR | 1020120098844 A | 9/2012 |
| TW | 201201332 A | 1/2012 |
| TW | 201203409 A | 1/2012 |

\* cited by examiner

FAN-OUT PACKAGE AND METHODS OF FORMING THEREOF

PRIORITY CLAIM AND CROSS-REFERENCE

This application is a continuation of U.S. patent application Ser. No. 15/727,070, filed on Oct. 6, 2017, entitled "Fan-Out Package and Methods of Forming Thereof," which is a continuation of U.S. patent application Ser. No. 14/322,842, filed on Jul. 2, 2014, entitled "Fan-Out Package and Method of Forming Thereof," which application claims the benefit of U.S. Provisional Application No. 61/928,836, filed on Jan. 17, 2014, entitled "Method and Apparatus for Packaging Semiconductor Dies," which applications are hereby incorporated herein by reference in their entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies may also require smaller packages that utilize less area than packages of the past, in some applications.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a fan-out package structure. Other embodiments may also be applied, however, to other package structures. Figures and discussion below illustrate simplified structures so as to not obscure various features and omit redundant features that would be apparent to a person of ordinary skill in the art. Like reference numbers in the figures refer to like components. Although method embodiments may be described as being performed in a particular order, other embodiments may be performed in any logical order.

FIGS. 1 through 8 illustrate various cross sectional views of structures during a manufacturing process according to an embodiment.

Figure 1:
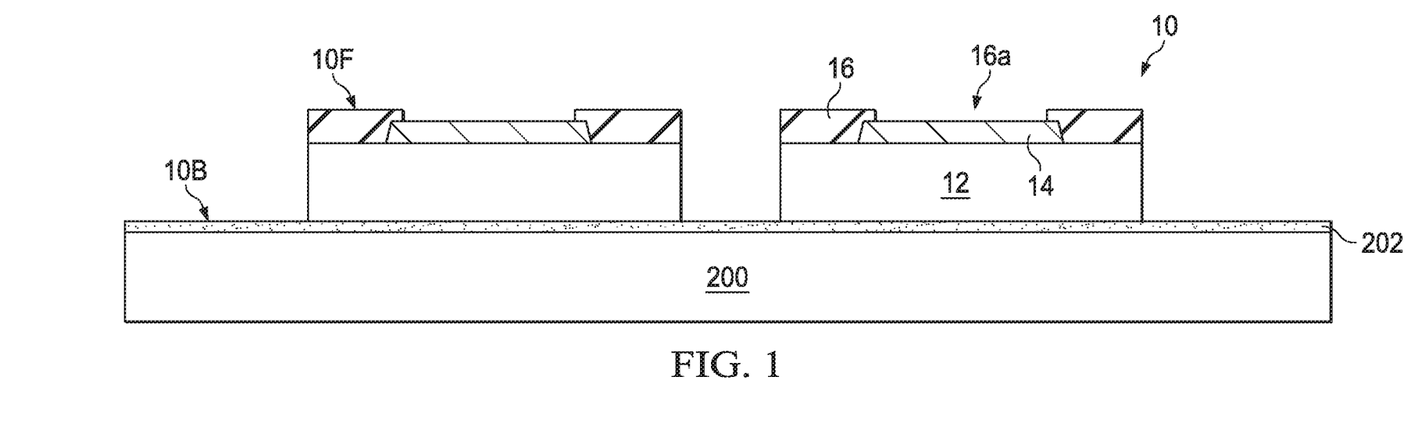
FIGS. 1 through 8 are various cross sectional views of structures during a manufacturing process according to an embodiment.

FIG. 1 illustrates two chips 10 adhered to a carrier substrate 200 by an adhesive film 202. In an embodiment, the chips 10 are formed as part of a wafer, and the wafer is then singulated to form individual chips 10. The chips 10 may be, for example, a logic integrated circuit, a memory die, an analog die, or any other die. The chips 10 each includes a substrate 12, a contact pad 14 on the substrate 12 and a passivation layer 16 overlying the substrate 12 and the contact pad 14. The substrate 12 may include a semiconductor substrate, such as a bulk semiconductor substrate, semiconductor-on-insulator substrate, or the like, on which electrical circuitry including active devices, such as transistors, and/or passive devices, such as capacitors, inductors, or the like, are formed according to semiconductor processes. The electrical circuitry formed in the semiconductor substrate may be any type of circuitry suitable for a particular application. For example, the electrical circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may executed using various structures including memory structures, processing structures, sensors, amplifiers, power distribution, input/output circuitry, or the like. Other circuitry may be used as appropriate for a given application. Dielectric layers and metal lines are formed on the electrical circuitry. The dielectric layers may be formed, for example, of a low dielectric constant (low-K) dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method, such as spinning, chemical vapor deposition (CVD), and/or plasma-enhanced CVD (PECVD). The metal lines formed of, for example, copper, tungsten, aluminum and/or alloys thereof are formed in the dielectric layers and electrically couple the electrical circuitry together and/or to the contact pad 14.

The contact pad 14 is formed on the uppermost dielectric layer of the substrate 12 to electrically connect to the underlying metallization layers. In some embodiments, the contact pads 14 are formed of aluminum, aluminum copper, aluminum alloys, copper, copper alloys, or the like. The passivation layer 16 is formed over the top surface of the substrate 12 and is patterned to form an opening 16a exposing at least a portion of the contact pad 14. The passivation layer 16 may be a single layer or a laminated multi-layer structure. In some embodiments, the passivation layer 16 is formed of a dielectric material, such as undoped silicate glass (USG), silicon nitride, silicon oxide, silicon oxynitride, or a non-porous material. In some embodiments, the passivation layer 16 is formed by chemical vapor deposition (CVD), physical vapor deposition (PVD), or any other suitable process.

In an embodiment, the chips 10 are placed on the carrier substrate 200 using, for example, a pick-and-place tool, and the chips 10 are adhered to the carrier substrate 200 by the adhesive film 202, such as any suitable adhesive, such as UV glue (which loses its adhesive property when exposed to UV lights), or film on wire (FOW) materials. The carrier substrate 200 may be a wafer-form substrate or a panel-form substrate. Several dozen chips 10 or several hundred chips 10 or more may be attached to the carrier substrate 200, depending on a size of the chips 10, a size of carrier substrate 200, and the particular application. The chip 10 has a first side 10F (also referred to herein as a front side 10F) and a second side 10B (also referred to herein as a back side 10B). By placing the chips 10 in predetermined locations on the carrier substrate 200, in some embodiments, a back side 10B of the chip 10 is attached to the adhesive film 202, such that the chip 10 is mounted face-up on the carrier substrate 200.

Figure 2:
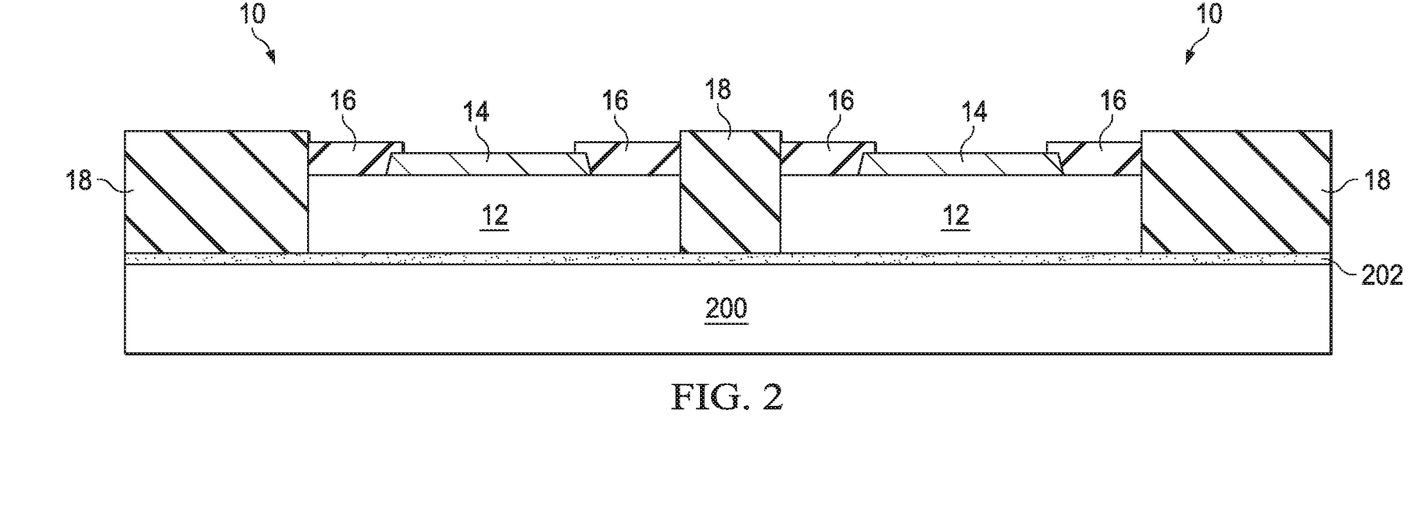

In FIG. 2, a molding compound 18 is formed at least laterally encapsulating the chips 10. By laterally encapsulating, it is meant that the molding compound is formed to surround the chip(s) on all sides, but not extending over the top surface of the chip(s). The molding compound 18 is formed to fill gaps between the chips 10. The molding compound 18 may be formed using compression molding, lamination, or the like. The molding compound 18 may be an epoxy-based complex or the like. The molding compound 18 may be cured using, for example, a constant temperature or a ramped temperature thermal process at a temperature between about 120° C. and about 340° C. The molding compound 18 may initially cover, i.e. extend over to top surface of, chips 10 as formed, and then undergo a grinding process to expose a sacrificial layer (not shown) over the chips 10. The sacrificial layer may be removed using a solvent, chemicals, or the like. In an example, a wet etch selective to the sacrificial layer, such as a dilute KOH solution that is, for example, about 3% to about 5% KOH, is used to remove the sacrificial layer. In some embodiments, the front sides 10F of chips 10 are not covered by the molding compound 18, such that the contact pads 14 and the passivation layers 16 are exposed. In an embodiment, the top surface of the passivation layer 16 is lower than the top surface of the molding compound 18. In some embodiments, the top surface of the passivation layer 16 is substantially level with the top surface of the molding compound 18.

Figure 3:
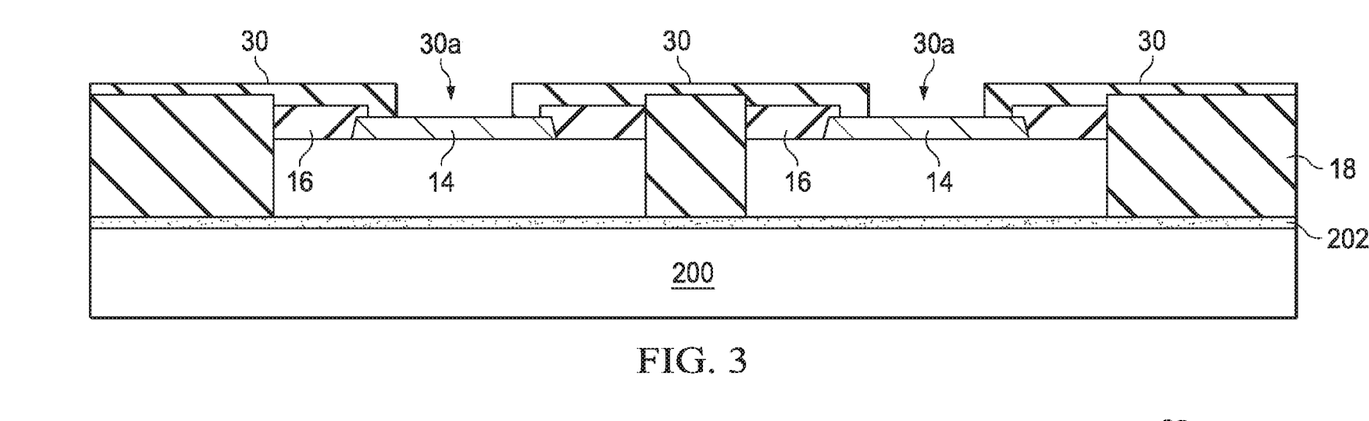

Referring to FIG. 3, a first dielectric layer 30 is formed over the passivation layers 16 and contact pads 14 of the chips 10 and over the molding compound 18. In some embodiments, the first dielectric layer 30 includes a polybenzoxazole (PBO) layer, a polyimide layer, a benzocyclobutene (BCB) layer, an epoxy layer, a photo-sensitive material layer, other suitable polymer materials, or a combination thereof. The first dielectric layer 30 can be deposited by a spin coating process, laminating process, the like, or a combination thereof. Then the first dielectric layer 30 is patterned by photolithography and/or etching processes to form openings 30a, through which the underlying contact pads 14 are exposed. In at least some embodiments, the opening 30a is positioned over the opening 16a of the passivation layer 16. In the illustrated embodiment, the dimension (e.g. diameter) of opening 30a is less than that of opening 16a. The dimension of the opening 30a may be larger than or equal to that of the opening 16a, in other contemplated embodiments.

Figure 4:
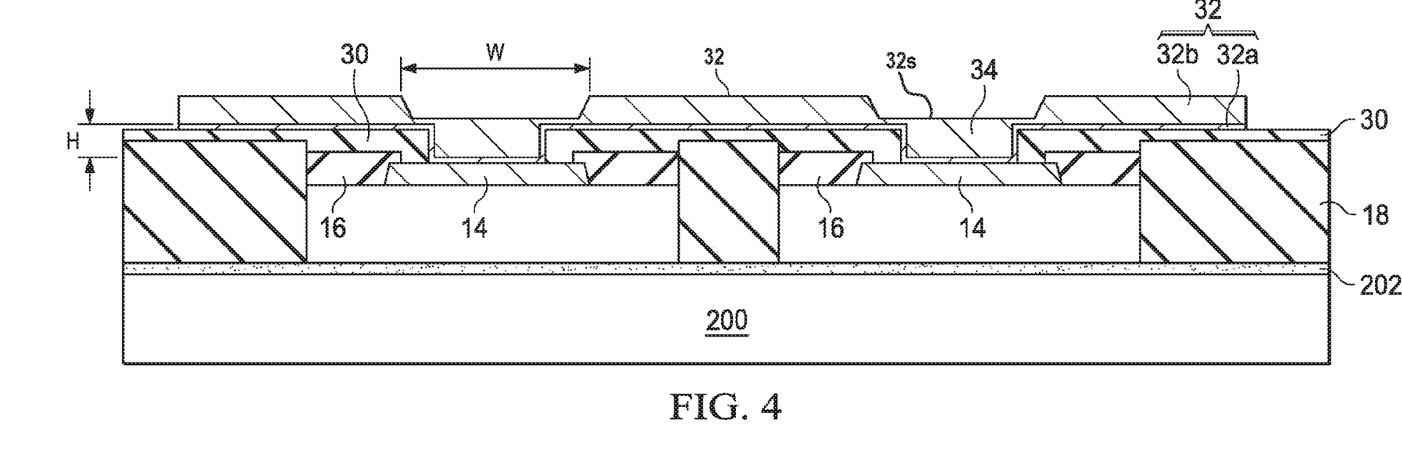

In FIG. 4, a first metallization layer 32 is formed on the first dielectric layer 30 as various traces, and the first metallization layer 32 fills the openings 30a to form a plurality of first via connections 34 directly over a respective contact pad 14. In some embodiments, the first via connection 34 (when viewed from a "top down" view) can be a ring shape, a ring-like shape, a rectangular shape, a square-like shape, a triangular shape, a hexagonal shape, an octagonal shape, or the like. Also, the first via connection 34 may be an enclosed shape, broken or disconnected shape. In an embodiment, the first metallization layer 32 includes a first seed layer 32a and a first conductive layer 32b. For example, the first seed layer 32a is deposited over the first dielectric layer 30, lining the bottom and sidewalls of the openings 30a of the first dielectric layer 30. The first seed layer 32a can be copper, titanium, titanium, titanium nitride, titanium nitride, a combination of copper and titanium (Ti/Cu), the like, or a combination thereof deposited by atomic layer deposition (ALD), sputtering, another physical vapor deposition (PVD) process, or the like. The conductive layer 32b is formed on the first seed layer 32a and fills the openings 30a of the first dielectric layer 30. The first conductive layer 32b can be copper, copper alloys, aluminum, aluminum alloys, tungsten, tungsten alloys, or combinations thereof, formed by a plating process, such as electroless plating, electroplating, or the like. In an embodiment, a copper plating process is performed by modifying additive selection and controlling concentration of copper solution, such that the surface of the first conductive layer 32b in the opening 30a forms a flat metal surface 32s. For example, the copper plating process is performed at a plating rate greater than about 1 μm/min. The first conductive layer 32b formed in the opening 30a has a width W and a height H. For example, the height H is less than 10 μm. The height H may be about 3 μm. In an embodiment, the ratio of W/H is greater than about 2. In another embodiment, the ratio of W/H is less than about 20. In still another embodiment, the ratio of W/H is between 2 and 20. Next, photolithography and etching processes are performed to pattern the first conductive layer 32b and the first seed layer 32a so as to form the pattern for the first metallization layer 32 that is desired. The first metallization layer 32 is a post-passivation interconnect (PPI) structure which can function as interconnection layers, power lines, re-distribution lines (RDL), inductors, capacitors or any passive components.

Figure 5:
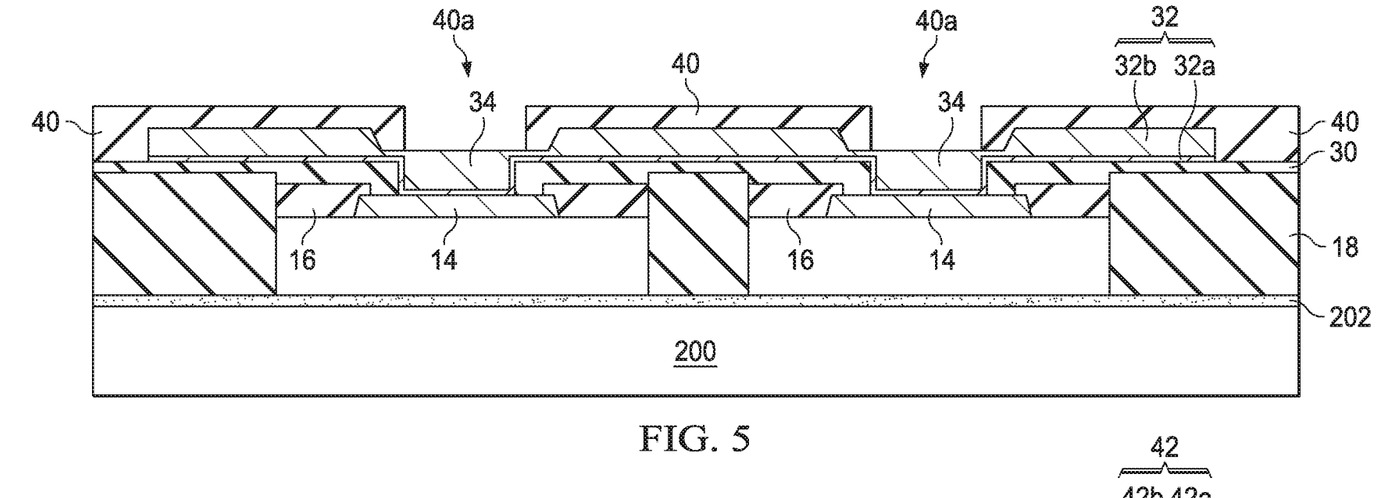
Figure 6:
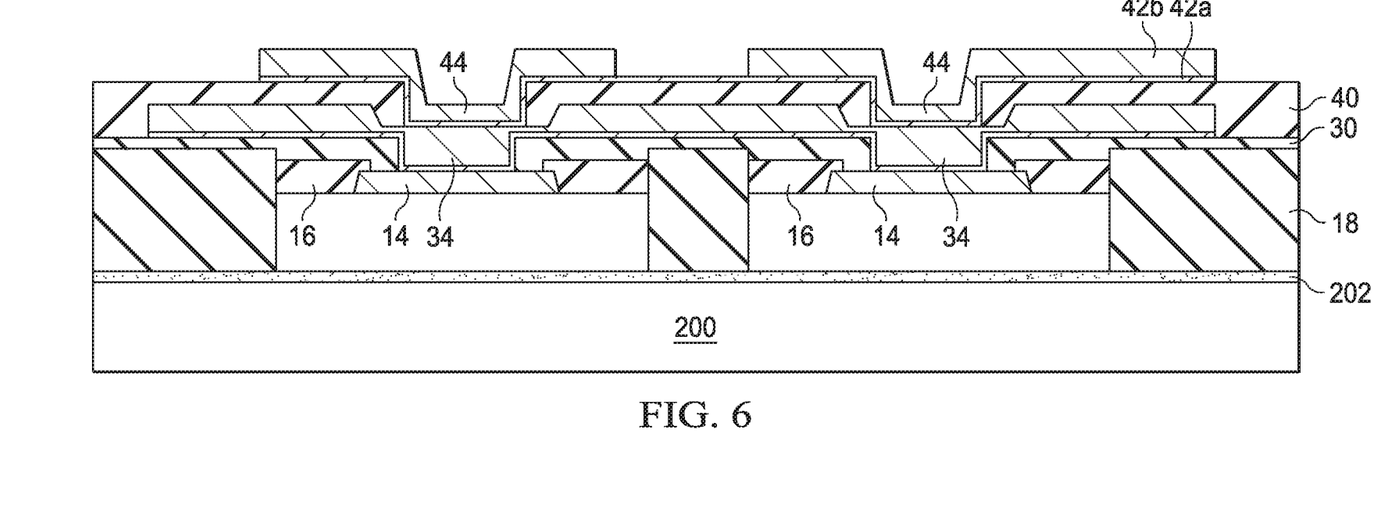

In FIG. 5, a second dielectric layer 40 is formed over the first dielectric layer 30 and the first metallization layer 32. In some embodiments, the second dielectric layer 40 includes a polybenzoxazole (PBO) layer, a polyimide layer, a benzocyclobutene (BCB) layer, an epoxy layer, a photo-sensitive material layer, other suitable polymer materials, or a combination thereof. The second dielectric layer 40 can be deposited by a spin coating process, laminating process, the like, or a combination thereof. Then the second dielectric layer 40 is patterned by photolithography and/or etching processes to form openings 40a, through which portions of the underlying first metallization layer 32 are exposed. In at least some embodiments, the first via connection 34 is exposed by the opening 40a because the opening 40a is positioned over the opening 30a of the first dielectric layer 30. For example, the dimension of the opening 40a is substantially equal to that of the opening 30a. The dimension of the opening 40a may be larger than or less than that of the opening 30a Next, as shown in FIG. 6, a second metallization layer 42 is formed on the second dielectric layer 40 as various traces or landing pads, and the second metallization layer 42 is formed in the openings 40a to form a plurality of second via connections 44 directly over a respective first via connection 34. In some embodiments, the second via connection 44 is a ring shape, a ring-like shape, a rectangular shape, a square-like shape, a triangular shape, a hexagonal shape, an octagonal shape, or the like. Also, the second via connection 44 may be an enclosed shape, broken or disconnected shape.

In an embodiment, the second metallization layer 42 includes a second seed layer 42a and a second conductive layer 42b. For example, the second seed layer 42a is deposited over the second dielectric layer 40, lining the bottom and sidewalls of the openings 40a of the second dielectric layer 40. The second seed layer 42a can be copper, titanium, titanium nitride, titanium nitride, a combination of copper and titanium (Ti/Cu), the like, or a combination thereof deposited by atomic layer deposition (ALD), sputtering, another physical vapor deposition (PVD) process, or the like. The second conductive layer 42b is formed on the second seed layer 42a. The second conductive layer 42b is also formed in the openings 40a of the second dielectric layer 40. The second conductive layer 42b may partially fill the opening 40a (as shown in FIG. 6) or completely fill the opening 40a (not shown) depending on the opening size and plating process control. The second conductive layer 42b can be copper, copper alloys, aluminum, aluminum alloys, tungsten, tungsten alloys, or combinations thereof, formed by a plating process, such as electroless plating, electroplating, or the like. Next, photolithography and etching processes are performed to pattern the second conductive layer 42b and the second seed layer 42a so as to expose the pattern for the second metallization layer 42 that is desired. The second metallization layer 42 includes the second via connection 44 electrically coupled to the first via connection 34. The second metallization layer 42 can function as interconnection layers, power lines, redistribution lines (RDL), inductors, capacitors or any passive components. While via connection 44 is shown as being vertically aligned with via connection 34, other arrangements, such as via connection 44 being offset from via connection 34, are within the contemplated scope of the present disclosure.

Figure 7:
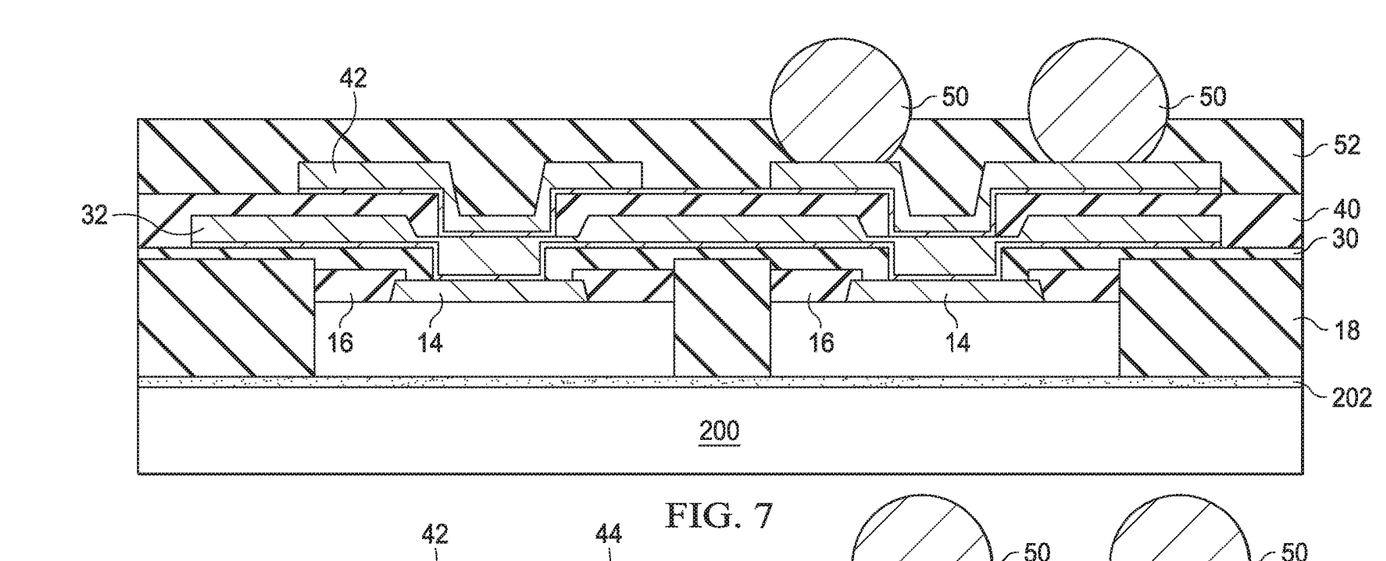

Referring to FIG. 7, bumps 50 are formed on the second metallization layer 42. In an embodiment, the bumps 50 are solder bumps, for example, including lead-free solder, SnAg, or a solder material including alloys of tin, lead, silver, copper, nickel, bismuth, or combinations thereof. The solder bumps may be formed by placing solder balls or plating a solder layer with a reflowing process. In some embodiments, the bump 50 is a copper pillar bump, a metal bump including nickel or gold, or combinations thereof. In an embodiment, each of the bumps 50 has a diameter greater than about 200 μm. Then a protection layer 52 is optionally formed over the second metallization layer 42 and the second dielectric layer 40 and around a portion of the bumps 50. For example, the top portions 50a of the bumps 50 are exposed and extend above the protection layer 52. In an embodiment, the protection layer 52 is a bracing material which is molding compound or the like that provides structural support.

Figure 8:
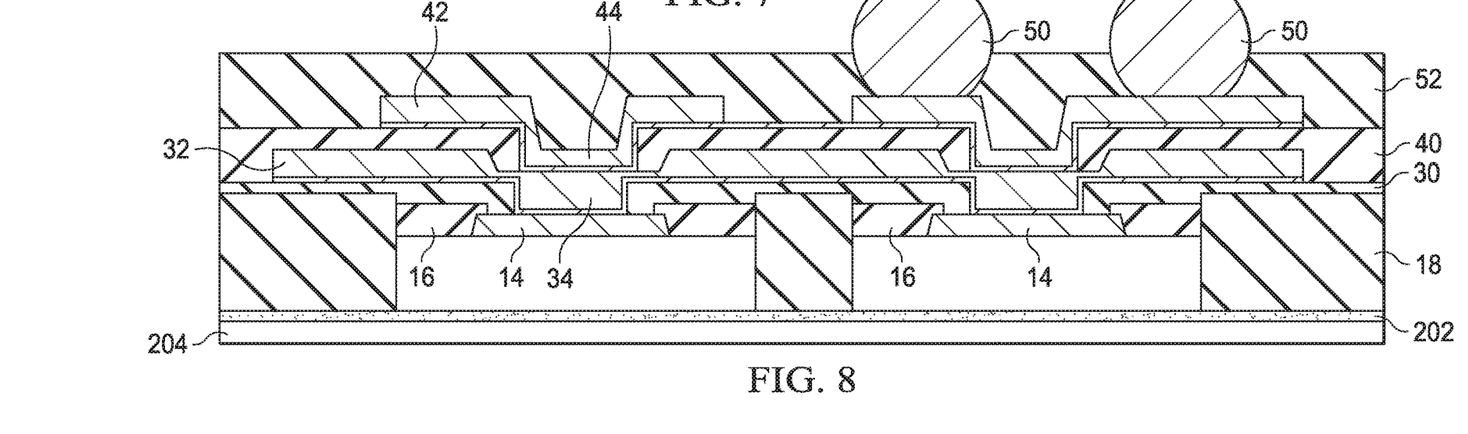

Next, as shown in FIG. 8, the carrier substrate 200 is detached from the chips 10 and the molding compound 18, and then the resulting structure is sawed into a plurality of individual packages also referred to as fan-out packages. In an embodiment, a tape 204 is provided on the adhesive film 202 covering the back side 10B of the chips 10 and the backside of the molding compound 18. The fan-out package includes one or more than one chips 10 and two metallization layers 32 and 42 over the front side 10F of the chip 10, in which a stacking via structure 54 including the second via connection 44 and the first via connection 34 are positioned over and electrically coupled to the contact pad 14 of the chip 10. As shown, the first via connection 34 is formed in the opening 30a of the first dielectric layer 30. The first via connection 34 includes the first seed layer 32a lining the bottom and sidewall of the opening 30a and the first conductive layer 32b filling the opening 30a. The top surface of the first via connection 34 includes a flat metal surface according to an embodiment. The second via connection 44 is formed in the opening 40a of the second dielectric layer 40. The second via connection 44 includes the second seed layer 42a lining the bottom and sidewall of the opening 40a and the second conductive layer 42b in the opening 40a. The second via connection 44 is formed over the first via connection 34 such that the second seed layer 42a is sandwiched between the first conductive layer 32b and the second conductive layer 42b. By modifying the plating rate for the first conductive layer 32b and forming the ratio of W/H of the first conductive layer 32b, a flat metal surface can be formed on the first via connection 34 and a thickness gap between the molding compound 18 and the first dielectric layer 30 can be minimized, and therefore a photolithographic window for the second dielectric layer 40 is enlarged and a fine-pitch fan-out package is achieved. Additionally, costs may be reduced using some embodiments.

One embodiment is a structure including a chip including a substrate and a contact pad on the substrate. A molding compound laterally encapsulates the chip with none of the molding compound being vertically aligned with the chip. A first dielectric layer overlies the molding compound and the chip. The structure further includes a first metallization layer having a first portion and a second portion, the first portion of the first metallization layer overlying the first dielectric layer and the second portion of the first metallization layer extending through the first dielectric layer electrically coupled to the contact pad. The second portion of the first metallization layer has a flat top. A second dielectric layer overlies the first metallization layer and the first dielectric layer. The structure further includes a second metallization layer having a first portion and second portion, the first portion of the second metallization layer overlying the second dielectric layer and the second portion of the second metallization layer extending through the second dielectric layer electrically coupled to the first metallization layer. The second portion of the second metallization layer is vertically aligned with the second portion of the first metallization layer.

Another embodiment is a structure that includes a chip including a substrate and a contact pad on the substrate, where the contact pad is covered by a chip passivation layer. The structure also includes a molding compound laterally encapsulating the chip. A first dielectric layer overlies the molding compound and the chip. The structure further includes a first metallization layer having a first portion and a second portion, the first portion of the first metallization layer overlying the first dielectric layer and the second portion of the first metallization layer extending through the first dielectric layer and the chip passivation layer. The second portion of the first metallization layer has a first lateral interface and a second lateral interface with the first dielectric layer. The second portion of the first metallization layer has a flat top from the first lateral interface to the second lateral interface. The structure further includes a second dielectric layer overlying the first metallization layer and a second metallization layer having a first portion and a second portion. The first portion of the second metallization layer overlies the second dielectric layer and the second portion of the second metallization layer extends through the second dielectric layer and contacts the first metallization layer. The second portion of the second metallization layer does not extend into the first dielectric layer.

A further embodiment is a structure including a chip with a contact pad and a molding compound surrounding sides of the chip. The structure further includes a passivation layer overlying the contact pad, the passivation layer having sidewalls which interface with the molding compound. A first dielectric layer overlies the molding compound and the passivation layer. A first conductive layer overlies the first dielectric layer, a first portion of the first conductive layer extending through the first dielectric layer and through the passivation layer and contacting the contact pad. The first portion of the first conductive layer has a width (w) and a height (h), where h is at least as great as a thickness of the first dielectric layer adjacent to the first portion of the first conductive layer. The first portion of the first conductive layer has a flat top surface, and a ratio of w:h is greater than 2. The structure includes a second dielectric layer overlying the first conductive layer and the first dielectric layer and a second conductive layer overlying the second dielectric layer, where a first portion of the second conductive layer extends through the second dielectric layer and physically contacts the first conductive layer.

An embodiment is a package including a chip having a substrate and a contact pad on the substrate and a molding compound laterally encapsulating the chip. A first dielectric layer is formed overlying the molding compound and the chip and has a first opening exposing the contact pad. A first metallization layer is formed overlying the first dielectric layer, in which the first metallization layer fills the first opening. A second dielectric layer is formed overlying the first metallization layer and the first dielectric layer and has a second opening over the first opening. A second metallization layer is formed overlying the second dielectric layer and formed in the second opening.

Another embodiment is package including a chip having a substrate and a contact pad on the substrate, and a molding compound laterally encapsulating the chip. A first dielectric layer is formed overlying the molding compound and the chip and has a first opening exposing the contact pad. A first seed layer is formed overlying the first dielectric layer and lines a sidewall and a bottom of the first opening. A first conductive layer is formed overlying the first seed layer and fills the first opening. A second dielectric layer is formed overlying the first conductive layer and has a second opening directly over the first opening. A second seed layer is formed overlying the second dielectric layer and lines a sidewall and a bottom of the second opening. A second conductive layer is formed overlying the second seed layer.

A further embodiment is a method including: providing a chip with a contact pad; forming a molding compound laterally encapsulating the chip, the contact pad being exposed through the molding compound; forming a first dielectric layer over the molding compound and the chip; forming a first opening in the first dielectric layer exposing the contact pad; forming a first conductive layer overlying the first dielectric layer and filling the first opening, wherein the first conductive layer in the first opening has a flat surface; forming a second dielectric layer over the first conductive layer and the first dielectric layer; forming a second opening in the second dielectric layer exposing the first conductive layer over the first opening; and forming a second conductive layer overlying the second dielectric layer and physically contacting the first conductive layer through the second opening.

Another embodiment is a method including depositing a molding compound laterally encapsulating a chip and depositing a first dielectric layer overlying the molding compound and the chip. A first opening is patterned in the first dielectric layer, the first opening exposing a contact of the chip. After patterning the first opening, a first metallization layer is deposited over the first dielectric layer and in the first opening, where a first portion of the first metallization layer overlies the first dielectric layer, and a second portion of the first metallization layer extends through the first dielectric layer and is electrically coupled to the contact. The second portion of the first metallization layer has a flat top. A second dielectric layer is deposited over the first metallization layer and the first dielectric layer. A second opening is patterned in the second dielectric layer, the second opening exposing the first metallization layer. A second metallization layer is deposited in the second opening, the second metallization layer having a third portion within sidewalls of the second opening, the third portion having a top surface with an angled portion adjacent each sidewall of the second opening of the second dielectric layer. In an embodiment, depositing the first metallization layer includes plating a material of the first metallization layer in the first opening at a plating rate greater than 1 m per minute. In an embodiment, the second opening is patterned directly over the second portion of the first metallization layer. In an embodiment, prior to depositing the molding compound, a passivation layer is deposited over the contact of the chip, exposing the contact of the chip through the passivation layer, where the molding compound extends vertically higher than an upper surface of the passivation layer. In an embodiment, a first seed layer is deposited in the first opening prior to depositing the first metallization layer, the first seed layer extending along an upper surface of the first dielectric layer. In an embodiment, the first opening has a width 2 to 20 times greater than its height. In an embodiment, depositing the first metallization layer further includes extending the flat top of the second portion to protrude above an upper surface of the first dielectric layer.

Another embodiment is a method including forming a molding compound laterally encapsulating a chip, a contact pad of the chip being exposed through the molding compound. A first dielectric layer is deposited over the molding compound and the chip and a first opening is patterned in the first dielectric layer, the first opening exposing the contact pad, the first opening having a width 2 to 20 times greater than its height. A first seed layer is formed in the first opening and a plating solution is controlled and plating additives are controlled to plate a first conductive layer on the first seed layer with a plating rate greater than 1 m per minute. A second dielectric layer is formed over the first conductive layer and the first dielectric layer and a second opening is formed in the second dielectric layer exposing the first conductive layer over the first opening. A second conductive layer is formed overlying the second dielectric layer and physically contacting the first conductive layer through the second opening. In an embodiment, forming the second conductive layer uses a deposition technique different than that used in plating the first conductive layer, including atomic layer deposition, sputtering, or physical vapor deposition. In an embodiment, plating the first conductive layer includes plating a first portion of the first conductive layer in the first opening, and plating a second portion of the first conductive layer adjacent the first opening over an upper surface of the first dielectric layer. In an embodiment, plating the first conductive layer further includes extending an upper surface of the first portion of the first conductive layer to be vertically higher than an upper surface of the first dielectric layer. In an embodiment, plating the first conductive layer further includes laterally extending a flat upper surface of the first portion beyond a width of the first opening. In an embodiment, a solder bump is formed on the second conductive layer, and a protection layer is deposited over the second conductive layer and around a portion of the solder bump. In an embodiment, forming the second opening in the second dielectric layer further includes forming the second opening directly over the contact pad.

Another embodiment is a method including forming a molding compound laterally encapsulating a chip, a contact pad of the chip being exposed through the molding compound. A first dielectric layer is deposited over the molding compound and the chip and a first opening is patterned in the first dielectric layer, the first opening exposing the contact pad. A first conductive layer is formed overlying the first dielectric layer and filling the first opening, where the first conductive layer in the first opening has a flat surface, where the flat surface is vertically further from the chip than a top surface of the first dielectric layer. A second dielectric layer is formed over the first conductive layer and the first dielectric layer. A second opening is formed in the second dielectric layer exposing the first conductive layer over the first opening. A second conductive layer is formed overlying the second dielectric layer and physically contacting the first conductive layer through the second opening. In an embodiment, forming the first conductive layer includes plating a material of the first conductive layer in the first opening at a plating rate greater than 1 m per minute. In an embodiment, the first opening has a width to height ratio of 2 to 20. In an embodiment, the flat surface of the first conductive layer extends beyond a width of the first opening, where the flat surface of the first conductive layer interfaces with an angled portion of the first conductive layer outside the first opening. In an embodiment, a solder bump is formed over the second conductive layer, a protection layer is deposited over the second conductive layer and around a lower portion of the solder bump. In an embodiment, the second opening is patterned directly over the contact pad.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   depositing a molding compound laterally encapsulating a chip;
   depositing a first dielectric layer overlying the molding compound and the chip;
   patterning a first opening in the first dielectric layer, the first opening exposing a contact of the chip;
   after patterning the first opening, depositing a first metallization layer over the first dielectric layer and in the first opening, a first portion of the first metallization layer overlying the first dielectric layer, a second portion of the first metallization layer extending through the first dielectric layer and electrically coupled to the contact, wherein the second portion of the first metallization layer has a flat top;
   depositing a second dielectric layer overlying the first metallization layer and the first dielectric layer;
   patterning a second opening in the second dielectric layer, the second opening exposing the first metallization layer; and
   depositing a second metallization layer in the second opening, the second metallization layer having a third portion within sidewalls of the second opening, the third portion having a top surface with an angled portion adjacent each sidewall of the second opening of the second dielectric layer.

2. The method of claim 1, wherein depositing the first metallization layer comprises: plating a material of the first metallization layer in the first opening at a plating rate greater than 1 μm per minute.

3. The method of claim 1, wherein the second opening is patterned directly over the second portion of the first metallization layer.

4. The method of claim 1, further comprising:
   prior to depositing the molding compound, depositing a passivation layer over the contact of the chip; and
   exposing the contact of the chip through the passivation layer, wherein the molding compound extends vertically higher than an upper surface of the passivation layer.

5. The method of claim 1, further comprising:
   depositing a first seed layer in the first opening prior to depositing the first metallization layer, the first seed layer extending along an upper surface of the first dielectric layer.

6. The method of claim 1, wherein the first opening has a width 2 to 20 times greater than its height.

7. The method of claim 1, wherein depositing the first metallization layer further comprises, extending the flat top of the second portion to protrude above an upper surface of the first dielectric layer.

8. A method comprising:
   forming a molding compound laterally encapsulating a chip, a contact pad of the chip being exposed through the molding compound;
   depositing a first dielectric layer over the molding compound and the chip;
   patterning a first opening in the first dielectric layer, the first opening exposing the contact pad, the first opening having a width 2 to 20 times greater than its height;
   forming a first seed layer in the first opening;
   controlling a plating solution and plating additives to plate a first conductive layer on the first seed layer with a plating rate greater than 1 μm per minute;
   forming a second dielectric layer over the first conductive layer and the first dielectric layer;
   forming a second opening in the second dielectric layer exposing the first conductive layer over the first opening; and
   forming a second conductive layer overlying the second dielectric layer and physically contacting the first conductive layer through the second opening.

9. The method of claim 8, wherein forming the second conductive layer uses a deposition technique different than that used in plating the first conductive layer, the deposition technique comprising atomic layer deposition, sputtering, or physical vapor deposition.

10. The method of claim 8, wherein plating the first conductive layer comprises:
   plating a first portion of the first conductive layer in the first opening; and
   plating a second portion of the first conductive layer adjacent the first opening over an upper surface of the first dielectric layer.

11. The method of claim 10, wherein plating the first conductive layer further comprises:
   extending an upper surface of the first portion of the first conductive layer to be vertically higher than an upper surface of the first dielectric layer.

12. The method of claim 11, wherein plating the first conductive layer further comprises:
   laterally extending a flat upper surface of the first portion beyond a width of the first opening.

13. The method of claim 8, further comprising:
   forming a solder bump on the second conductive layer; and
   depositing a protection layer over the second conductive layer and around a portion of the solder bump.

14. The method of claim 8, wherein forming the second opening in the second dielectric layer further comprises:
   forming the second opening directly over the contact pad.

15. A method comprising:
   forming a molding compound laterally encapsulating a chip, a contact pad of the chip being exposed through the molding compound;
   depositing a first dielectric layer over the molding compound and the chip;
   patterning a first opening in the first dielectric layer, the first opening exposing the contact pad;
   forming a first conductive layer overlying the first dielectric layer and filling the first opening, wherein the first conductive layer in the first opening has a flat surface, wherein the flat surface is vertically further from the chip than a top surface of the first dielectric layer;
   forming a second dielectric layer over the first conductive layer and the first dielectric layer;
   forming a second opening in the second dielectric layer exposing the first conductive layer over the first opening; and
   forming a second conductive layer overlying the second dielectric layer and physically contacting the first conductive layer through the second opening.

16. The method of claim 15, wherein forming the first conductive layer comprises: plating a material of the first conductive layer in the first opening at a plating rate greater than 1 μm per minute.

17. The method of claim 15, wherein the first opening has a width to height ratio of 2 to 20.

18. The method of claim 15, wherein the flat surface of the first conductive layer extends beyond a width of the first opening, wherein the flat surface of the first conductive layer interfaces with an angled portion of the first conductive layer outside the first opening.

19. The method of claim 15, further comprising:
   forming a solder bump over the second conductive layer; and
   depositing a protection layer over the second conductive layer and around a lower portion of the solder bump.

20. The method of claim 15, wherein second opening is patterned directly over the contact pad.

* * * * *